(12) United States Patent
Choi

(10) Patent No.: US 9,200,361 B2
(45) Date of Patent: Dec. 1, 2015

(54) DEPOSITION APPARATUS PROVIDING IMPROVED REPLACING APPARATUS FOR DEPOSITION RATE MEASURING SENSOR, AND REPLACING METHOD USING THE SAME

(71) Applicant: Samsung Display Co., Ltd., Yongin, Gyeonggi-Do (KR)

(72) Inventor: Eun-Sun Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 259 days.

(21) Appl. No.: 13/874,371

(22) Filed: Apr. 30, 2013

(65) Prior Publication Data

US 2014/0165747 A1 Jun. 19, 2014

(30) Foreign Application Priority Data

Dec. 13, 2012 (KR) .......................... 10-2012-0145715

(51) Int. Cl.
*C23C 14/54* (2006.01)

(52) U.S. Cl.
CPC .................................. *C23C 14/542* (2013.01)

(58) Field of Classification Search
None
See application file for complete search history.

(56) References Cited

U.S. PATENT DOCUMENTS

| 7,017,430 B2* | 3/2006 | Cross et al. ................ 73/865.8 |
| 7,964,037 B2* | 6/2011 | Fukuda et al. ............... 118/726 |
| 2012/0114840 A1* | 5/2012 | Fukuda et al. .................. 427/9 |

FOREIGN PATENT DOCUMENTS

| KR | 10-2007-0051609 A | 5/2007 |
| KR | 10-2007-0105596 A | 10/2007 |
| KR | 10-2010-0004165 A | 1/2010 |
| KR | 10-2011-0047314 A | 5/2011 |

* cited by examiner

*Primary Examiner* — Robert R Raevis
(74) *Attorney, Agent, or Firm* — Christie, Parker & Hale, LLP

(57) ABSTRACT

A deposition apparatus includes a vacuum chamber, a sensor head located in the vacuum chamber and including a plurality of deposition rate measuring sensors, a sensor extractor coupled to the vacuum chamber and including a first vacuum maintaining valve, the sensor extractor being configured to extract one of the deposition rate measuring sensors to outside the vacuum chamber, and a sensor inserter coupled to the vacuum chamber and including a second vacuum maintaining valve, the sensor inserter being configured to insert one of the deposition rate measuring sensors into the sensor head.

6 Claims, 3 Drawing Sheets

DEPOSITION APPARATUS PROVIDING IMPROVED REPLACING APPARATUS FOR DEPOSITION RATE MEASURING SENSOR, AND REPLACING METHOD USING THE SAME

CROSS-REFERENCE TO RELATED PATENT APPLICATION

This application claims priority to and the benefit of Korean Patent Application No. 10-2012-0145715, filed on Dec. 13, 2012, in the Korean Intellectual Property Office, the disclosure of which is incorporated herein in its entirety by reference.

BACKGROUND

1. Field

The present invention relates to a thin film deposition apparatus.

2. Description of the Related Art

In a thin film manufacturing process, such as for forming a thin film for an organic light emitting display, a deposition process of generating vapor from a deposition source and making the vapor adhere to a surface of a substrate is commonly used.

Through the deposition process, a thin film of suitable thickness having a desired pattern is formed on the substrate.

Furthermore, a deposition rate measuring sensor may be installed in a vacuum chamber where the deposition process occurs. The deposition rate measuring sensor, generally referred to as a crystal sensor, senses the deposition rate in the vacuum chamber and is used in the process of measuring the thickness of a thin film being formed on the substrate.

When the deposition rate measuring sensor is repetitively used, its lifespan comes to an end and needs to be replaced. Replacing the deposition rate measuring sensor generally involves a cumbersome process of releasing a vacuum state in the vacuum chamber, replacing the deposition rate measuring sensor, and re-creating the vacuum state in the vacuum chamber. This may result in additional time and/or inefficiency of the deposition process.

SUMMARY

According to an embodiment of the present invention, a deposition apparatus is provided for replacing a deposition rate measuring sensor without releasing a vacuum state in a vacuum chamber and a method of replacing the deposition rate measuring sensor using the deposition apparatus.

The deposition apparatus according to an embodiment of the present invention includes a vacuum chamber; a sensor head located in the vacuum chamber including a plurality of deposition rate measuring sensors; a sensor extractor coupled to the vacuum chamber and including a first vacuum maintaining valve, the sensor extractor being configured to extract one of the deposition rate measuring sensors to outside vacuum chamber; and a sensor inserter coupled to the vacuum chamber and including a second vacuum maintaining valve, the sensor inserter being configured to insert one of the deposition rate measuring sensor into the sensor head.

The sensor head may be rotatably mounted in the vacuum chamber such that one of the plurality of deposition rate measuring sensors is located at a measuring location and another of the deposition rate measuring sensors is located at a replacing location.

The sensor head may include a sensor plate on which the plurality of deposition rate measuring sensors are located and an electrode plate on which a plurality of electrodes are located.

The sensor plate may include separable pieces, and each of the pieces may include at least one of the plurality of deposition rate measuring sensors.

Each of the plurality of deposition rate measuring sensors may include a crystal sensor.

Also, the deposition apparatus according to another embodiment of the present invention includes a vacuum chamber; a support rotatably mounted in the vacuum chamber and having locations separated into a deposition rate measuring location and a replacing location; and a plurality of sensor heads, each of the plurality of sensor heads including a plurality of deposition rate measuring sensors and being at a location on the support.

The support may further have a standby location and one of the plurality of sensor heads may be located at the standby location.

Each of the plurality of sensor heads may include a sensor plate on which the plurality of deposition rate measuring sensors are located and an electrode plate on which a plurality of electrodes are located.

Each of the plurality of deposition rate measuring sensors may include a crystal sensor.

Also, a method of replacing a deposition rate measuring sensor according to an embodiment of the present invention includes preparing a sensor extractor coupled to a vacuum chamber and including a first vacuum maintaining valve, the sensor extractor configured to extract the deposition rate measuring sensor from a sensor head in the vacuum chamber, and preparing a sensor inserter coupled to the vacuum chamber and including a second vacuum maintaining valve, the sensor inserter configured to insert the deposition rate measuring sensor into the sensor head; extracting the deposition rate measuring sensor located at a replacing location from the sensor head through the sensor extractor while maintaining a vacuum state in the vacuum chamber, and inserting another deposition rate measuring sensor into the vacuum chamber through the sensor inserter while maintaining the vacuum state.

Also, a method of replacing the deposition rate measuring sensor according to another embodiment of the present invention includes rotatably mounting a support having a measuring location and a replacing location separated by at least one vacuum maintaining valve; measuring a deposition rate by rotating the support to move a sensor head into the measuring location after mounting a plurality of the sensor heads on the support at the replacing location, each of the plurality of sensor heads including a plurality of the deposition rate measuring sensors; and returning one of the plurality of sensor heads to the replacing location by rotating the support, and replacing the sensor head located at the replacing location.

By using the deposition apparatus and the method of replacing the deposition rate measuring sensor according to embodiments of the present invention, the deposition rate measuring sensor may be rapidly and efficiently replaced without releasing (or removing) the vacuum state, improving production efficiency of the deposition and ultimately stabilizing quality of products manufactured by employing the deposition apparatus. Additional aspects and/or features of the invention will be set forth in part in the description which follows and, in part, will be obvious from the description, or may be learned by practice of the invention.

BRIEF DESCRIPTION OF THE DRAWINGS

The above and other features and aspects of the present invention will become more apparent by describing exemplary embodiments in detail with reference to the attached drawings.

DETAILED DESCRIPTION

Hereinafter, an embodiment of the present invention will be described in greater detail with reference to the enclosed drawings.

First, a deposition apparatus according to an embodiment of the present invention will be described with reference to FIGS. 1 to 3.

Figure 1:
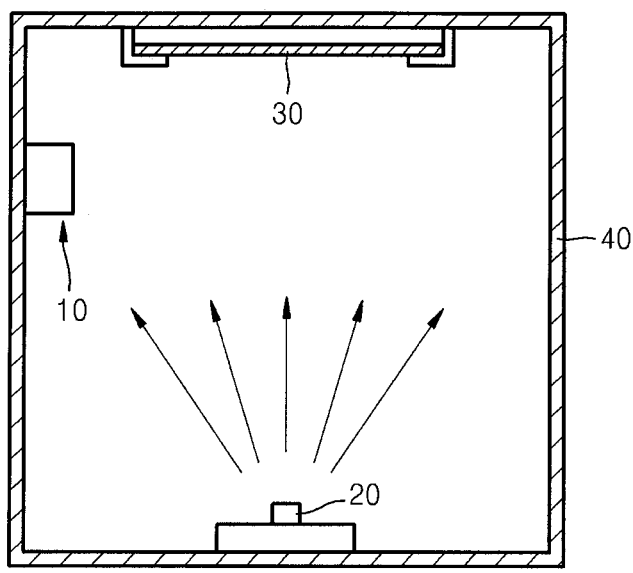
FIG. 1 is a schematic view illustrating a deposition apparatus having a deposition rate measuring part according to an embodiment of the present invention.

As shown in FIG. 1, a deposition apparatus according to an embodiment of the present invention includes a vacuum chamber 40 for receiving a substrate 30 where a thin film (not shown) is to be formed and a deposition source 20 venting deposition vapor in a direction generally toward the substrate 30. Hence, a thin film having a desired pattern may be formed on the substrate 30 by operating the deposition source 20 in the vacuum chamber 40 while a vacuum state is maintained.

Furthermore, a deposition rate measuring part 10 is installed in the vacuum chamber 40 to measure conditions of forming the thin film (e.g., measure the deposition rate). The deposition rate measuring part 10 may sense (or measure) an amount of deposition vapor supplied from the deposition source 20 and the sensed or measured amount of deposition vapor may be used in measuring (or estimating, and then adjusting) a thickness of the thin film formed on the substrate 30.

Figure 2:
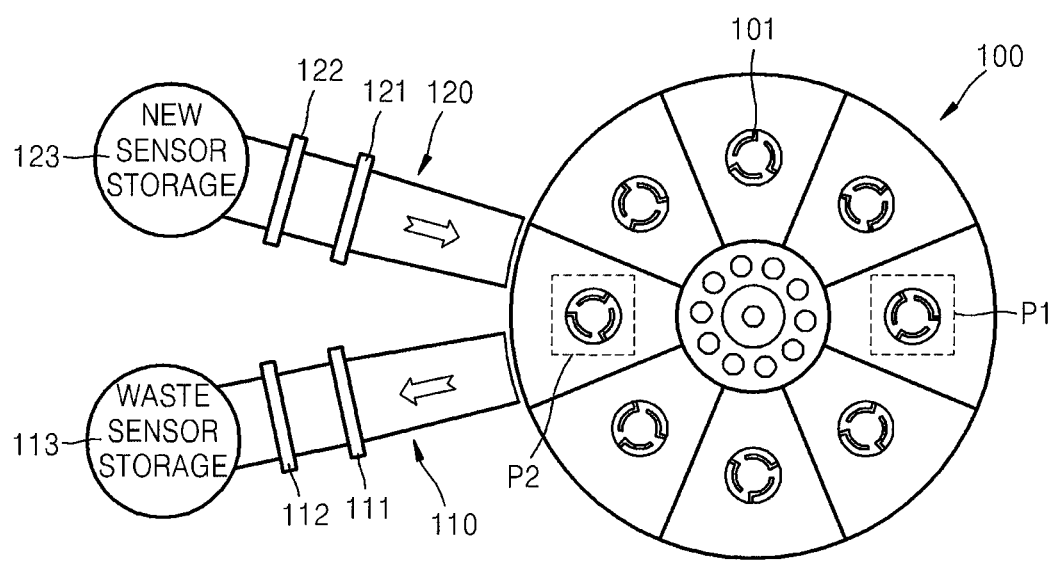
FIG. 2 illustrates a structure of the deposition rate measuring part shown in FIG. 1.
Figure 3:
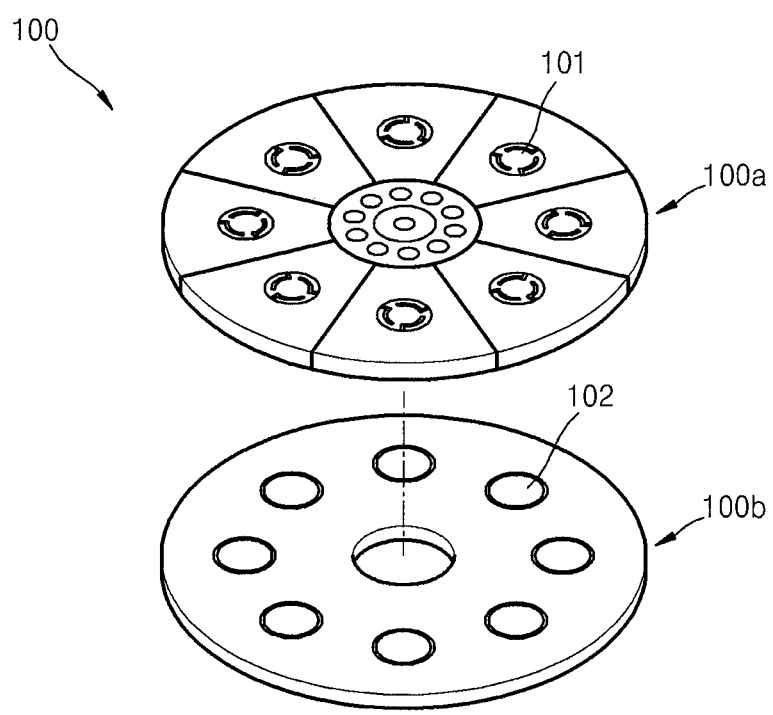
FIG. 3 is a perspective view illustrating a structure of the sensor head shown in FIG. 2; and, FIG. 4 illustrates a structure of a deposition rate measuring part according to another embodiment of the present invention.

FIGS. 2 and 3 show a sensor head 100 equipped (or included) in the deposition rate measuring part 10. In order to efficiently replace a plurality of deposition rate measuring sensors 101, the sensor head 100 is structured as follows.

In the embodiment shown in FIG. 3, the sensor head 100 has a coupled structure of a sensor plate 100a provided with the deposition rate measuring sensors 101 (e.g., mounted or installed thereon) and an electrode plate 100b including a plurality of electrodes 102 (e.g., mounted or installed thereon). Each of the plurality of electrodes 102 may face and contact a corresponding one of the plurality of deposition rate measuring sensors 101. The sensor plate 100a may be formed of a plurality of separable pieces, each piece including at least one of the plurality of deposition rate measuring sensors 101. Hence, an individual piece of the sensor plate 100a may be extracted and a new piece may be inserted in place where the individual piece was extracted.

Each deposition rate measuring sensor 101 that is shown in FIGS. 2 and 3, may include a crystal sensor.

As shown in FIG. 2, the sensor head 100 may rotate. According to the degree of rotation of the sensor head 100, a deposition rate measuring sensor 101 located at a measuring location P1 may measure the deposition rate, and a deposition rate measuring sensor 101 located at a replacing location P2 may be replaced. A plurality of other deposition rate measuring sensors 101 are on standby for use or replacement.

Furthermore, the deposition rate measuring part 10 is equipped with a sensor extractor 110 and a sensor inserter 120, both connected to (e.g., coupled to) the vacuum chamber 40 for extracting or inserting, respectively, the deposition rate measuring sensors 101 without releasing the vacuum state in the vacuum chamber 40 by using vacuum maintaining valves 111, 112, 121, and 122. Generally, the vacuum state is lifted for extracting or inserting the deposition rate measuring sensors 101 in the vacuum chamber 40. In this embodiment, however, a deposition rate measuring sensor 101 may be replaced while maintaining the vacuum state in the vacuum chamber 40 using the vacuum maintaining valves 111, 112, 121, and 122.

For example, to extract the deposition rate measuring sensor 101 located at the replacing location P2 through (e.g., using) the sensor extractor 110, the deposition rate measuring sensor 101 may be extracted from the sensor head 100, moved to be between (e.g., located between) the inner and outer vacuum maintaining valves 111 and 112 by opening the inner vacuum maintaining valve 111 while leaving the outer vacuum maintaining valve 112 closed. Then, when the deposition rate measuring sensor 101 is located between the inner and outer vacuum maintaining valves 111 and 112, the sensor extractor 110 opens and connects to an external waste sensor storage 113 by first closing the inner vacuum maintaining valve 111 and then opening the outer vacuum maintaining valve 112. As a result, the deposition rate measuring sensor 101 may be extracted without releasing the vacuum state in the vacuum chamber 40. Herein, extracting and moving the deposition rate measuring sensor 101 may be performed, for example, by a general robot arm or a transfer tray, and the like, and a detailed description of these is omitted as these are devices known to a person of ordinary skill in the art to which the present invention pertains.

Also, a new deposition rate measuring sensor 101 may be inserted into the sensor head 100 from a new sensor storage 123 through (e.g., using) the sensor inserter 120. The deposition rate measuring sensor 101 may be moved to be between (e.g., located between) the inner and outer vacuum maintaining valves 121 and 122 by opening the outer vacuum maintaining valve 122 while leaving the inner vacuum maintaining valve 121 closed. Then, when the deposition rate measuring sensor 101 is located between the inner and outer vacuum maintaining valves 121 and 122, the sensor inserter 120 opens and connects to the vacuum chamber 40 by first closing the outer vacuum maintaining valve 122 and then opening the inner vacuum maintaining valve 121. As a result, the new deposition rate measuring sensor 101 may be inserted into the sensor head 100 without releasing the vacuum state in the vacuum chamber 40. Herein, moving and loading (e.g., inserting) the deposition rate measuring sensor 101 may be performed, for example, by a general robot arm or a transfer tray, and the like.

The embodiment of the present invention as described above may be operated as follows.

First, the deposition source 20 and the substrate 30 are each prepared in the vacuum chamber 40 and a vacuum state is created in the vacuum chamber 40.

After a vacuum state is created in the vacuum chamber 40, the deposition source 20 is operated to vent deposition gases generally toward the substrate 30. Of the plurality of deposition rate measuring sensors 101 installed on the sensor head 100 of the deposition rate measuring part 10, the deposition rate measuring sensor 101 located at the measuring location P1 measures the deposition rate in the vacuum chamber 40.

Hence, the deposition rate measuring sensor 101 may sense or measure the amount of deposition vapor supplied from the deposition source 20 to measure (e.g., estimate or calculate) a thickness of a thin film formed on the substrate 30.

Thereafter, the deposition rate measuring sensor 101 located at the replacing location P2 may be replaced when needed. When the deposition rate measuring sensor 101 located at the replacing location P2 is an unused deposition rate measuring sensor 101, the deposition rate measuring sensor 101 may not be replaced and is on standby for use along with a plurality of other unused deposition rate measuring sensors 101. However, if the deposition rate measuring sensor 101 reached the replacing location P2 after a use and following a rotation of the sensor head 100, the deposition rate measuring sensor 101 at the replacing location P2 may be replaced with a new deposition rate measuring sensor 101 by operating (e.g., using) the sensor extractor 110 and the sensor inserter 120. When replacing the deposition rate measuring sensor 101, as described above, the sensor extractor 110 is operated first to extract the deposition rate measuring sensor 101 located at the replacing location P2 to the waste sensor storage location 113 and then the sensor inserter 120 is operated to insert the new deposition rate measuring sensor 101 from the new sensor storage 123.

In this embodiment, the used deposition rate measuring sensor 101 located at replacing location P2 may be moved to be between (e.g., located between) the inner and outer vacuum maintaining valves 111 and 112 by opening the inner vacuum maintaining valve 111 while leaving the outer vacuum maintaining valve 112 closed. When extracting the deposition rate measuring sensor 101, a corresponding piece of the sensor plate 100a may be extracted along with the extracted deposition rate measuring sensor 101. Then, when the deposition rate measuring sensor 101 is located between the inner and outer vacuum maintaining valves 111 and 112, the sensor extractor 110 opens to the external waste sensor storage 113 by first closing the inner vacuum maintaining valve 111 and then opening the outer vacuum maintaining valve 112, and the corresponding deposition rate measuring sensor 101 is then moved to the waste sensor storage 113.

Thereafter, the new deposition rate measuring sensor 101 is inserted between (e.g., moved to be located between) the inner and outer vacuum maintaining valves 121 and 122 by opening the outer vacuum maintaining valve 122 while leaving the inner vacuum maintaining valve 121 closed. The new deposition rate measuring sensor 101 may be inserted along with a corresponding piece of the sensor plate 100a. Then, when the deposition rate measuring sensor 101 is located between the inner and outer vacuum maintaining valves 121 and 122, the deposition rate measuring sensor 101 is inserted into an empty space in the sensor head 100 by first closing the outer vacuum maintaining valve 122 and then opening the inner vacuum maintaining valve 121 such that the sensor inserter 120 connects to (e.g., communicates with) the vacuum chamber 40.

As a result, replacing the deposition rate measuring sensor 101 occurs very efficiently because replacing the deposition rate measuring sensor 101 is possible during the deposition process without releasing the vacuum state in the vacuum chamber 40. As a result, productivity of the deposition increases greatly because the deposition process does not need to be stopped.

Figure 4:
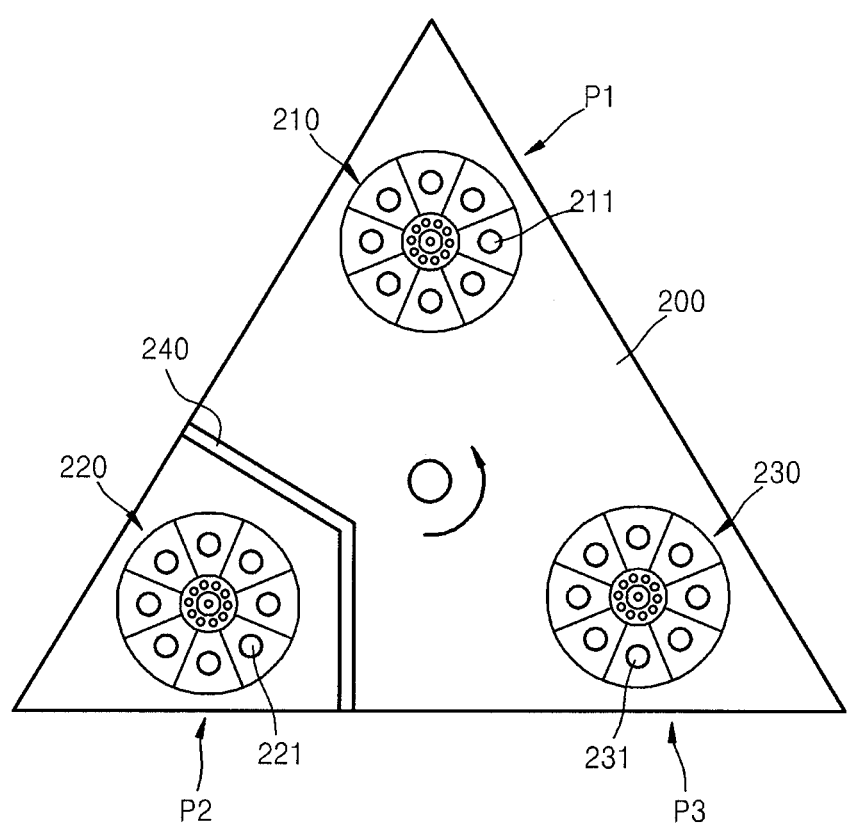

In the above embodiment of the present invention, an example of replacing the deposition rate measuring sensor 101 in units of deposition rate measuring sensors is provided; however, in another embodiment of the present invention, the deposition rate measuring sensor 101 may be replaced in units of sensor heads as shown in FIG. 4.

Referring to FIG. 4, a support 200 may be rotatably installed or mounted in the vacuum chamber 40, and the measuring location P1, the replacing location P2, and a standby location P3 may be defined on the support 200 in relation to the vacuum chamber 40. For example, the replacing location P2 may be separated from the other locations by a vacuum maintaining valve 240. When the deposition is in progress, the vacuum maintaining valve 240 may remain open such that both the vacuum chamber 40 and the replacing location P2 are in the same vacuum state. When a sensor head replacement is in progress, the vacuum maintaining valve 240 is closed and, thus, the vacuum chamber 40 and the replacing location P2 are separated (e.g., hermetically isolated) from each other. A plurality of deposition rate measuring sensors 211, 221, and 231 in the present embodiment may include crystal sensors, and each of the sensor heads 210, 220 and 230 may be manufactured to have a coupled structure of the sensor plate 100a coupled with the electrode plate 100b as shown in FIG. 3. In the described embodiment, as the support 200 is rotated (e.g., in a counter-clockwise direction as shown in FIG. 4), different ones of the sensor heads 210, 220 and 230 would be sequentially located in the locations P1, P2, and P3, respectively.

The deposition apparatus equipped with a deposition rate measuring sensor replacing apparatus as described in FIG. 4 may be operated as follows.

First, the deposition source 20 and the substrate 30 is prepared in the vacuum chamber 40, and a vacuum state created in the vacuum chamber 40.

After the vacuum state is created in the vacuum chamber 40, the deposition is processed by operating the deposition source 20. Herein, one of the plurality of deposition rate measuring sensors 211 of (e.g., included in) the sensor head 210 located at the measuring location P1 on the support 200 may measure the deposition rate in the vacuum chamber 40. Hence, when a lifespan of a deposition rate measuring sensor 211 is expended (e.g., used up), one of the plurality of remaining deposition rate measuring sensors 211 may measure the deposition rate.

Furthermore, a replacing process occurs, as needed, with respect to the sensor head 220 located at the replacing location P2 of the support 200. When the sensor head 220 located at the replacing location P2 is an unused sensor head 220, the sensor head 220 may not be replaced and is on standby along with the sensor head 230 located at the standby location P3. However, when the sensor head 220 returned to the replacing location P2 after use and according to the rotation of the support 200, the corresponding sensor head 220 may be replaced with a new sensor head 220. When replacing the sensor head 220, the inside of the vacuum chamber 40 and the replacing location P2 are separated (e.g., hermetically isolated) by closing the vacuum maintaining valve 240. Thereafter, the vacuum state at the replacing location P2 is released and the corresponding sensor head 220 is replaced with a new sensor head 220 equipped with a plurality of new deposition rate measuring sensors 221. After the sensor head 220 is replaced, a vacuum state is created in an area corresponding to the replacing location P2 and then the vacuum maintaining valve 240 is opened. Then, the replacement process of the sensor head 220 is complete without disturbing the vacuum state in the vacuum chamber 40. Thereafter, when the lifespan of each of the plurality of deposition rate measuring sensors 211 located at sensor head 210 located at the measuring location P1 is expended (e.g., used up), the used sensor head 210 returns (e.g., moves) to the replacing location P2 by rotating the support 200. Then, the sensor head 230 at the standby location P3 moves to the measuring location P1 and the plurality of deposition rate measuring sensors 231 mounted on (e.g., included in) the sensor head 230 may rotate and measure the deposition rate. The new sensor head 220 located at the replacing location P2 moves to the standby location P3 and waits to be used. Then, the used sensor head 210 is replaced by a new sensor head at the replacing location P2 by the same process.

As a result, a replacement of the sensor heads 210, 220, and 230 occurs very efficiently because replacing the sensor heads 210, 220, and 230 is possible during the deposition process without releasing the vacuum state in the vacuum chamber 40, and productivity of the deposition increases greatly because the deposition does not need to be stopped.

Consequently, when the deposition apparatus as described above is used, the deposition rate measuring sensors may be replaced rapidly and efficiently without releasing the vacuum state, thereby improving production efficiency and stabilizing quality of products manufactured by employing the deposition apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A deposition apparatus comprising:
   a vacuum chamber;
   a sensor head located in the vacuum chamber and comprising a plurality of deposition rate measuring sensors;
   a sensor extraction part coupled to the vacuum chamber and comprising a first vacuum maintaining valve, the sensor extraction part being configured to pass one of the deposition rate measuring sensors to outside the vacuum chamber; and
   a sensor insertion part coupled to the vacuum chamber and comprising a second vacuum maintaining valve, the sensor insertion part being configured to pass one of the deposition rate measuring sensors into the sensor head.

2. The deposition apparatus of claim 1, wherein the sensor head is rotatably mounted in the vacuum chamber such that one of the plurality of deposition rate measuring sensors is located at a measuring location and another of the deposition rate measuring sensors is located at a replacing location.

3. The deposition apparatus of claim 1, wherein the sensor head comprises a sensor plate on which the plurality of deposition rate measuring sensors are located and an electrode plate on which a plurality of electrodes are located.

4. The deposition apparatus of claim 3, wherein the sensor plate comprises separable pieces, and each of the pieces of the sensor plate comprises at least one of the plurality of deposition rate measuring sensors.

5. The deposition apparatus of claim 1, wherein each of the plurality of deposition rate measuring sensors comprises a crystal sensor.

6. A method for replacing a deposition rate measuring sensor, the method comprising:
   preparing a sensor extraction part coupled to a vacuum chamber and comprising a first vacuum maintaining valve, the sensor extraction part configured to pass the deposition rate measuring sensor from a sensor head in the vacuum chamber, and preparing a sensor insertion part coupled to the vacuum chamber and comprising a second vacuum maintaining valve, the sensor insertion part configured to pass the deposition rate measuring sensor into the sensor head;
   extracting the deposition rate measuring sensor located at a replacing location from the sensor head through the sensor extraction part while maintaining a vacuum state in the vacuum chamber; and
   inserting another deposition rate measuring sensor into the sensor head through the sensor insertion part while maintaining the vacuum state in the vacuum chamber.

\* \* \* \* \*